United States Patent [19]
Kircher et al.

[11] 4,295,147

[45] Oct. 13, 1981

[54] JOSEPHSON DEVICES OF IMPROVED THERMAL CYCLABILITY AND METHOD

[75] Inventors: Charles J. Kircher, Yorktown Heights; Hung-Chang W. Huang, Hopewell Junction; Masanori Murakami, Yorktown Heights, all of N.Y.

[73] Assignee: International Business Machines Corp., Armonk, N.Y.

[21] Appl. No.: 117,790

[22] Filed: Feb. 1, 1980

[51] Int. Cl.[3] ............ H01L 39/22

[52] U.S. Cl. ............ 357/5; 357/4; 427/62

[58] Field of Search ............ 357/5, 4; 427/62

[56] References Cited

U.S. PATENT DOCUMENTS

| | | | |
|---|---|---|---|
| 3,725,213 | 4/1973 | Pierce | 357/5 X |
| 3,733,526 | 5/1973 | Anacher et al. | 357/5 |
| 3,816,173 | 6/1974 | Eldridge et al. | 357/5 X |
| 3,852,795 | 12/1974 | Ames | 357/5 X |
| 3,999,203 | 12/1976 | Lahari | 357/5 |
| 4,012,756 | 3/1977 | Chaudhari et al. | 357/5 |

OTHER PUBLICATIONS

Deutscher et al., *Appl. Phys. Lett.,* vol. 27, No. 6, Sep. 15, 1975, p. 366 et seq.

*Primary Examiner*—Martin H. Edlow
*Attorney, Agent, or Firm*—Scully, Scott, Murphy & Presser

[57] ABSTRACT

Thin film electrodes particularly suited for Josephson devices of improved thermal cyclability are prepared by depositing thin films of superconductive metal and an intermetallic compound former on a substrate held at a temperature below about 100° K. and at a pressure below about $1\times10^{-7}$ Torr so that intermetallic compound formation occurs at the grain boundaries of the metal to inhibit grain growth. The thin film electrodes are characterized by median grain size $<100$ nm.

23 Claims, 2 Drawing Figures

JOSEPHSON DEVICES OF IMPROVED THERMAL CYCLABILITY AND METHOD

BACKGROUND OF THE INVENTION

1. Field of the Invention

This invention relates to Josephson devices and more particularly to such devices having improved thermal cyclability and the method of producing same.

2. Description of the Prior Art

Josephson devices are well-known in the art and generally include superconducting electrodes and a tunnel barrier between the superconducting electrodes. The tunnel barrier is commonly an oxide of the base metal of the electrode, although other materials may serve as the barrier. The tunnel barrier is extremely thin, usually from about 1 to about 10 nanometers, through which Josephson tunneling current can flow at zero voltage, with two tunneling states: a pair tunneling state in which Josephson current exists at zero junction voltage and a single particle tunneling state in which current exists at a finite voltage. These devices can be used to carry out logic and memory functions.

The production of Josephson devices is generally predicated on the formation of thin films of the component metals and poses difficult problems since the devices must show good stability over repeated thermal cycling, i.e. cyclability, and the tunneling resistance must be low in order to permit high Josephson current. In particular, stability of such thin films to repeated thermal cycling has heretofore posed considerable difficulty. Devices are subjected to temperatures ranging from 350° K. to 4.2° K. during fabrication and operation which subjects them to high strain during thermal cycling due to differences in thermal expansion coefficients of the device electrode and substrate materials. This is particularly characteristic of metals such as lead which have a low melting temperature and are desirable for use as superconducting electrodes of Josephson devices. Relaxation of strain can occur readily in such materials resulting, for example, in formation of hillocks, i.e. protrusions from the metal film surface, or dislocation steps which can break through the tunnel barrier of limited thickness and cause shorts between the first (base) and second (counter) electrodes.

To avoid the problems attendant to hillock formation and reduced thermal cyclability, U.S. Pat. No. 3,999,203 teaches the use of intermetallic compounds in the superconducting electrodes to provide suppression of strain relaxation. Thus, thin layers of lead alloys with gold and/or indium show greater stability and permit increased device thermal cyclability. The films produced by the method of this patent have average grain sizes ranging from 0.2 to 1 micron for 0.2 micron thick films.

While the foregoing approach has resulted in some improvement in the thermal cyclability of Josephson devices, there still remains the need for even further improvements which will result in Josephson devices for even greater stability, particularly stability to thermal cycling.

Improved strain behavior was observed in fine-grained lead films deposited at low substrate temperature, e.g. 77° K. (M. Murakami, *Thin Solid Films,* Vol. 59, p. 105 (1979). Such lead films have been used as counter electrodes for Nb/Pb tunneling junctions (U.S. Pat. No. 3,649,356). Pure lead films deposited at 77° K. have a grain size of about 0.25 micron for 0.2 micron film thickness and do not have sufficient chemical or thermal cycling stability for use in lead alloy Josephson devices. Josephson devices with niobium base electrodes have about three times higher junction capacitance per unit area and thus are less favorable for high speed switching applications.

SUMMARY OF THE INVENTION

This invention provides a new method for preparing films which are suitable for producing Josephson devices of improved stability. The improved stability is reflected in the fewer failures during repeated thermal cycling over a wide range of temperature. The improved stability of the films formed in accordance with the present new process is attributable to the fine grain size of the base electrode superconductor equal to or less than 100 nm, as produced by the process of the invention.

The reduced grain size of the film components is realized by a preparative method which includes the steps of forming a thin layer comprised of the superconductive metal at a temperature below about 100° K. and a pressure of about $\leqq 1\times10^{-7}$ Torr; and forming an intermetallic compound at the grain boundaries of the superconductor to limit grain growth during warming the resulting layer to ambient temperature and during subsequent processing.

The superconducting films can be prepared using well known methods such as evaporation in vacuum or sputtering or chemical or electrochemical plating. Usually, evaporation in vacuum is employed.

The superconductive metals to be employed in the present process are well known and include, for example, lead, indium, tin, bismuth, aluminum and mercury and alloys thereof, e.g., lead-indium, lead-bismuth and lead-tin alloys. The intermetallic compound formers are also well known and include gold, palladium, platinum and magnesium which form intermetallic compounds with lead, tin, indium and bismuth. In addition, bismuth forms an intermetallic compound with lead; silver and copper with tin; silver, copper and bismuth with indium. Other intermetallic compounds can be formed by selection of suitable superconductor and intermetallic compound former.

In order to realize the benefits of this invention the superconductor, as deposited at below about 100° K., must be fine-grained. In addition, some of the intermetallic compound must be formed at the grain boundaries of the superconductor to most effectively inhibit grain growth. This can be accomplished by depositing the intermetallic compound former on the superconductor and diffusing it into the grain boundaries of the superconductor so that the intermetallic compound forms at the grain boundaries before grain growth. Accordingly, the compound former should not be appreciably soluble in the superconductor, e.g. gold is insoluble in lead and forms a lead-gold intermetallic compound preferentially at the grain boundaries of lead in accordance with the present process. The diffusion of compound former and formation of the intermetallic compound occurs at a temperature lower than the temperature at which grain growth starts, i.e. recrystallization temperature as employed in this art.

The Josephson devices formed in accordance with the invention include at least the base electrode formed with the fine grain size films of the invention although preferably both the base electrode and the counter electrode can be formed of the present new fine-grain size films.

The thickness of the metallic films of the invention is normally that employed for making Josephson devices. For the formation of intermetallic compounds, the intermetallic compound former is applied in thin layers, e.g. 5 nanometer layer of gold on 100 nanometer layer of lead. In general, the amount of intermetallic compound former ranges from at least about 1 weight percent and can range up to about 20 weight percent of the superconductor, depending on the choice of compound former and superconductor.

The intermetallic compound can also be introduced in preformed state by co-evaporation with the superconductor.

For more detailed disclosure of the inclusion of intermetallic compounds in thin films, the disclosure of U.S. Pat. No. 3,999,203 is incorporated herein by reference.

The deposition of metallic layers to form the present new films is accomplished using standard techniques such as that described in U.S. Pat. Nos. 3,113,889 and 3,649,356, incorporated herein by reference for the disclosure of suitable procedures.

The superconductor layers produced in accordance with the invention can then be used to fabricate Josephson device components. Thus, the base electrode layers can be treated to produce the requisite barrier layer, as by oxidation of the layer surface using standard techniques, such as thermal oxidation or plasma oxidation as described in U.S Pat. No. 3,849,276. A counter electrode and subsequent wiring and insulation layers can be prepared (as in U.S. Pat. No. 3,852,795) and combined with the base electrode of the present invention to form completed Josephson devices.

The present new films, and Josephson devices produced therewith, may also be produced by other methods to obtain reduced grain size, for example, smaller substrate temperature reductions in combination with simultaneous evaporation of the superconductive metals and a grain-growth retardant, and/or seeding to nucleate smaller grain size films can be used. These methods could also be used along with the present method to obtain even smaller grain sizes.

All reference to grain size of the film layer components of course refers to median grain size.

DESCRIPTION OF THE PREFERRED EMBODIMENTS

Figure 1:
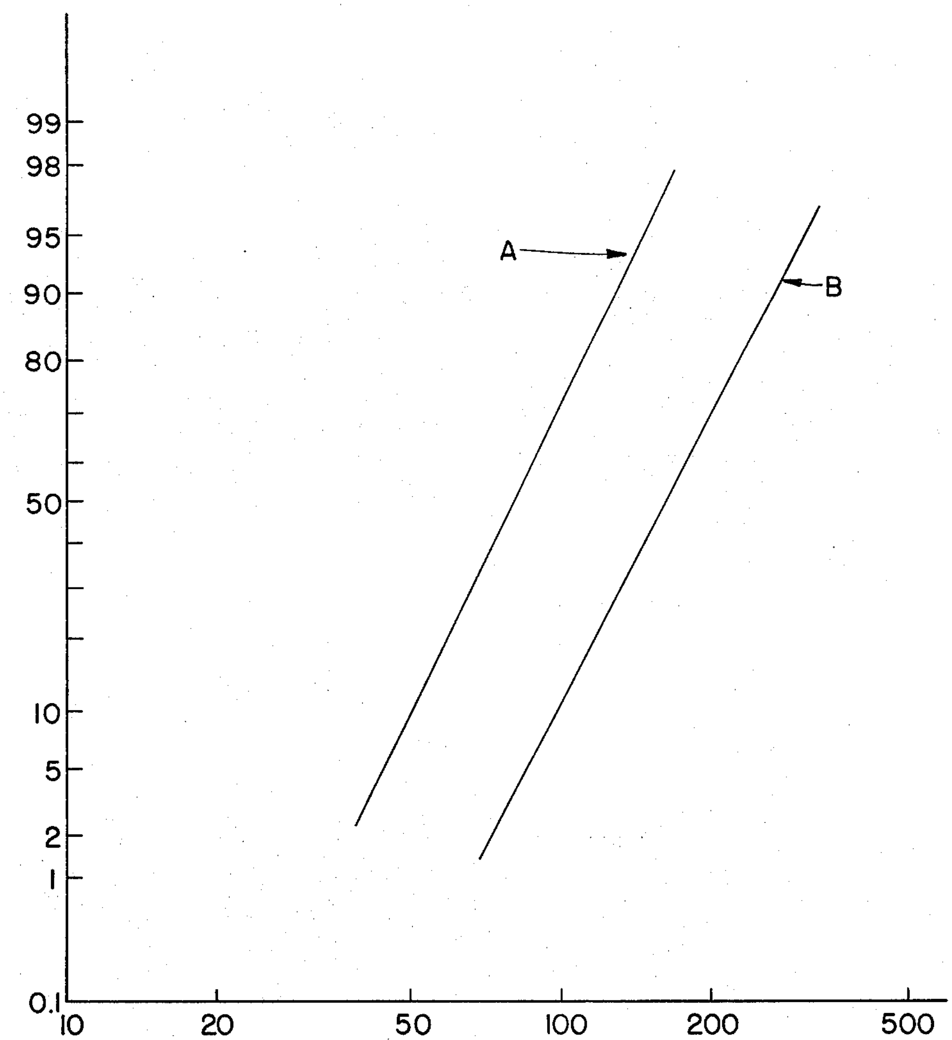
FIG. 1 is a plot of the cumulative percentage of grains in a Josephson device film having a grain size less than or equal to "g" versus grain size "g."

The varied operative steps of the inventive process are conveniently carried out in a single apparatus such as a vacuum film-forming device such as that described in U.S. Pat. No. 3,113,889. Alternatively, each of the operative steps can be carried out in separate vacuum reaction vessels which of course would be less efficient than the use of the single vacuum reactor, and therefore is not preferred.

Electrode substrates are cleaned prior to film deposition by a plasma oxidative treatment of the surfaces to be coated by use of an rf electrode in the presence of oxygen gas at reduced pressure. Typically, the substrate is attached to an rf electrode in a vacuum system and is cleaned using an rf oxygen glow discharge, for example at about 300 V at 10 mT oxygen for a period of about 10 minutes.

After cleaning, the substrates are then cooled to a temperature below 100° K. in an initial vacuum of about $10^{-8}$ Torr in a typical metal film coating device where the metal films are then deposited to the desired thickness. During deposition of the metals, the partial pressures of condensible gases such as water and carbon dioxide must be maintained below about $5\times10^{-8}$ Torr. Following film deposition, the resulting films are warmed to ambient temperature. The films thus obtained are suitable for Josephson device fabrication.

The films are deposited onto a substrate held at a temperature below about 100° K. to obtain reduced grain size. It is necessary for the superconductor layer to be sufficiently thin (e.g. $\leqq$100 nm for lead or lead-indium alloys) in order that the resultant superconductor-intermetallic compound composite have the desired grain size, i.e. $\leqq$100 nm. Because the electrode thicknesses desired for devices are typically 0.2–0.4 microns, the superconductor is deposited in layers of $\leqq$100 nm thicknesses separated by a thin layer of intermetallic compound former. This procedure also avoids the formation of large concentrations of intermetallic compounds adjacent to the tunnel barrier, thereby allowing Josephson junctions of good electrical quality to be obtained.

The proper selection of a compound former with a given superconductor will provide the requisite structure wherein the top and bottom surfaces will remain substantially free of intermetallic compound. A minimum of routine experimentation will identify suitable combinations of the said materials.

For example, to accomplish the aforesaid, the sequential deposition of lead, gold, lead and indium will provide a layer in which the intermetallic compound, in this case $AuIn_2$, is concentrated within the formed layer and no detectable amounts of $AuIn_2$ are present in the top surface and the resulting layer is suitable for fabricating the base electrode.

The amount of intermetallic compound former employed usually ranges from about 2% to about 10% by weight of the superconductor. The use of large amounts does not provide appreciable advantage and will tend to reduce the superconduction of the layer. The thicknesses of the resulting layer of superconductor and intermetallic compound can range from about 0.1 to about 1 micron, preferably about 0.2 to about 0.4 micron.

Using the inventive process, the films produced thereby are suitable for device fabrication. Devices produced therewith exhibited in excess of one hundred times fewer failures during repeated thermal cycling in the range of 350° to 4.2° K. The improved cyclability of the present devices is due to the fine grain size ($\leqq$100 nm) of the components of the metal films.

The films produced in accordance with the present process show good adhesion to the substrate and are essentially hole-free and hillock-free. The adhesion properties are enhanced by the cleaning step used to prepare the electrode substrate for metal film deposition and by avoiding the use of a noble metal intermetallic compound former (e.g., gold, platinum and palladium) as the first layer. Hole-free films are the result of minimizing the presence of condensible gases during film deposition. Hillock-free films are the result of assuring a fine grain size in the metal films and of minimizing the pressure of condensible gases during deposition.

DESCRIPTION OF THE SPECIFIC EMBODIMENTS

Device base electrodes were produced employing the following procedure:

electrode substrate is mounted on a holder in a vacuum chamber fitted with a suitable vacuum pump. The holder is an rf electrode that is provided with heating and cooling passages to permit temperature control. A vessel comprising the metal to be deposited on the substrate is provided in the vacuum chamber together with means for heating the vessel. A mask of the desired pattern for the electrode is mounted proximate the surface of the substrate, or prepared on the substrate by photoresist techniques.

Before deposition is commenced, the chamber is evacuated to a pressure of about $2\times10^{-8}$ Torr and the substrate is cleaned (rf electrode 360 V/10 m Torr $O_2$/10 minutes/24° C.), after which the substrate temperature was reduced to about 77° K.

The metal-containing vessels were heated to evaporate their respective metals at a controlled rate to deposit sequentially:

100 nm Pb at 3.5 nm/sec.
5 nm Au at 0.1 nm/sec.
60 nm Pb at 3.5 nm/sec.
35 nm In at 0.5 nm/sec.

The maximum pressure during deposition is $\leqq 1\times10^{-7}$ Torr in the vaporization chamber. After about 10 minutes, the metal film was warmed to 24° C.

The electrode was then removed from the vacuum chamber after repressurizing to atmospheric pressure.

FIG. 1 of the accompanying drawings was obtained by determining the grain size of the films so produced and plotting the cumulative percentage of grains of size ≦"g" versus the grain size "g" expressed in nm. From these data, it is apparent that the average grain size of the present metal films is ≦100 nm (line A) while the average grain size of Pb-In-Au films prepared in a manner that has resulted in the best Pb-In-Au alloy Josephson junction cyclability so far obtained (S. K. Lahiri, et al., *Journal of Applied Physics,* 49 (1978) 2880) employing the teachings of U.S. Pat. No. 3,999,203 is substantially above 100 nm corresponding to about 180 nm (line B).

Using the described procedure, Josephson devices were prepared and tested for stability to thermal cycling using the procedure described by S. Basavaiah and J. H. Greiner, *Journal of Applied Physics,* Vol. 48, No. 11, November 1977, pp. 4630–4633.

Figure 2:
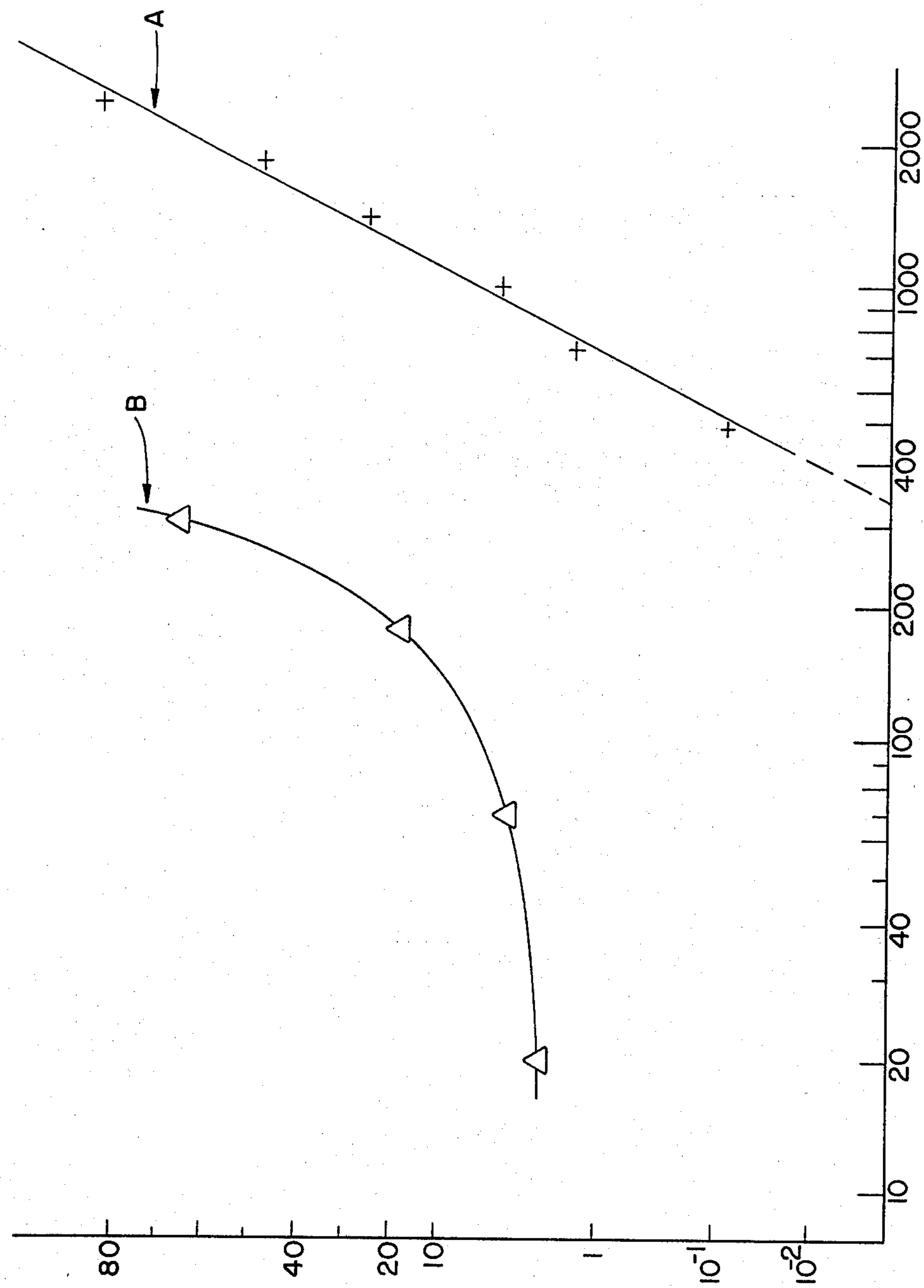
FIG. 2 is a plot of the percentage cumulative failures of Josephson devices versus the log of the number of thermal cycles.

FIG. 2 of the accompanying drawings is a graph of the results obtained with Josephson devices having base electrodes prepared in accordance with the invention (curve A) in comparison with those produced according to Lahiri, et al. (curve B). The counter electrodes were 0.4 micrometer thick Pb-29% Bi alloy for each group of junctions. In each case, wafers containing 1321 junctions per wafer were employed in the thermal cycling test described in the aforesaid literature article (incorporated herein by reference).

The graph plots the percent cumulative failures against the logarithm of the number of thermal cycles. As can be seen, curve A data shows a substantially higher stability for the devices produced according to the invention by a factor of at least about 100. Thus, the improvement in thermal cycling is attributed to the present process for deposition of the metal films which make up the Josephson base electrode.

The intermetallic compound, $AuIn_2$ is not present at the top surface of the film. It begins at about 30 nanometers below the top surface as determined by Auger spectroscopy and sputter-etch profiling. Thus, junctions of good electrical quality are obtained using base electrode films prepared by the inventive process.

Having thus described our invention, what we claim as new, and desire to secure by Letters Patent is:

1. A tunnel device exhibiting Josephson tunneling current comprising:
(a) a first electrode comprised of at least one superconductor, the grain size of the said superconductor being ≦100 nm;
(b) a tunnel barrier in contact with said first electrode comprised of an insulating layer and being sufficiently thin that Josephson current can tunnel therethrough; and
(c) a second electrode in contact with said tunnel barrier comprised of a superconductor.

2. The tunnel device according to claim 1 wherein said tunnel barrier comprises an oxide of the first electrode superconductor.

3. The tunnel device according to claim 1 wherein said first electrode further comprises at least one intermetallic compound formed at the grain boundaries of said superconductor.

4. The tunnel device according to claim 1 wherein said first electrode superconducting material comprises lead or lead-indium alloy.

5. The tunnel device according to claim 3 wherein said intermetallic compound comprises gold and indium.

6. The tunnel device according to claim 3 wherein said first electrode superconductor comprises lead or lead-indium alloy and said intermetallic compound comprises gold and indium.

7. The tunnel device according to claim 6 wherein the second electrode superconductor comprises lead or lead-bismuth alloy or lead-gold alloy.

8. The tunnel device according to claim 1 wherein said second electrode is comprised of at least one superconductor, the grain size being ≦100 nm.

9. The tunnel device according to claim 3 wherein said intermetallic compound is present in an amount of from about 1 to about 20 weight percent of said first electrode.

10. A tunnel device exhibiting Josephson tunneling current comprising:
(a) a first electrode comprised of at least one superconductor and at least one intermetallic compound, said intermetallic compound being present at the grain boundaries of said superconductor, the grain size of said superconductor being ≦100 nm;
(b) a tunnel barrier on said first electrode being sufficiently thin to permit Josephson tunneling therethrough; and
(c) a second electrode on said tunnel barrier comprised of a superconductor.

11. The tunnel device according to claim 10 wherein said superconductor comprises lead or lead-indium alloy.

12. The tunnel device according to claim 10 wherein said superconductor comprises lead or lead-indium alloy and said intermetallic compound comprises gold and indium.

13. The tunnel device according to claim 12 wherein the second electrode superconductor comprises lead or lead-bismuth alloy or lead-gold alloy.

14. The tunnel device according to claim 13 wherein said tunnel barrier is an oxide of said superconductor.

15. An electrode for use in a tunnel device exhibiting Josephson tunneling current comprising a thin layer of at least one superconductor and at least one intermetallic compound present at the grain boundaries thereof, the grain size of said superconductor being ≦100 nm, and the surface of said layer being substantially free of said intermetallic compound.

16. The electrode according to claim 15 further comprising a tunnel barrier on said layer and being sufficiently thin that Josephson current can tunnel therethrough.

17. The electrode according to claim 16 wherein said tunnel barrier comprises an oxide of said superconductor.

18. The electrode according to claim 15 wherein said superconductor comprises lead or lead-indium alloy.

19. The electrode according to claim 15 wherein said intermetallic compound comprises gold and indium.

20. The electrode according to claim 15 wherein said superconductor comprises lead or lead-indium alloy and said intermetallic compound comprises gold and indium.

21. An electrode for use in a tunnel device exhibiting Josephson tunneling current comprising a thin layer of lead or lead-indium alloy having a grain size ≦100 nm and an intermetallic compound of gold and indium present at the grain boundaries thereof, the surface of said layer being substantially free of said intermetallic compound.

22. Th electrode according to claim 21 further comprising a tunnel barrier on said layer and being sufficiently thin that Josephson current can tunnel therethrough.

23. The electrode according to claim 22 wherein said tunnel barrier comprises an oxide of said electrode.

* * * * *